United States Patent [19]
Yamagata et al.

[11] Patent Number: 5,410,428
[45] Date of Patent: Apr. 25, 1995

[54] OPTICAL MEMBER MADE OF HIGH-PURITY AND TRANSPARENT SYNTHETIC SILICA GLASS AND METHOD FOR PRODUCTION THEREOF OR BLANK THEREOF

[75] Inventors: Shigeru Yamagata; Michiyou Kuriyama; Kyoichi Inaki, all of Kohriyama, Japan; Ralf Takke, Hanau, Germany

[73] Assignees: Shin-Etsu Quartz Products Co. Ltd., Tokyo, Japan; Heraeus Quarzglas GmbH, Hanau, Germany

[21] Appl. No.: 779,737

[22] Filed: Oct. 23, 1991

[30] Foreign Application Priority Data

Oct. 30, 1990 [JP] Japan .................. 2-292483
Oct. 30, 1990 [JP] Japan .................. 2-292484
Nov. 26, 1990 [JP] Japan .................. 2-321736
Dec. 26, 1990 [JP] Japan .................. 2-413881
Dec. 26, 1990 [JP] Japan .................. 2-413885

[51] Int. Cl.⁶ .............................. G02B 1/00; C03C 4/08
[52] U.S. Cl. ...................................... 359/350; 359/900; 252/588; 501/53; 501/905
[58] Field of Search ............... 359/350, 355, 642, 900; 501/53, 94, 900, 905; 252/588

[56] References Cited

U.S. PATENT DOCUMENTS 5,028,967 7/1991 Yamada et al. .............. 359/355
5,086,352 2/1992 Yamagata et al. ........... 252/588 X
5,141,786 8/1992 Shimizu et al. .............. 501/53 X

FOREIGN PATENT DOCUMENTS 1-201664 8/1989 Japan .

OTHER PUBLICATIONS

F. L. Galeener, "Planar Rings in Vitreous Silica" *J. Non-Crys. Sol.*, 49 (1982) pp. 53–62.
F. L. Galeener, "Planar Rings in Glasses" *Solid State Communications*, vol. 44, No. 7, pp. 1037–1040 (1982).
"Measuring Method for Striae in Optical Glass" Japanese Optical Glass Industrial Standards JOGIS 11 (1975).
D. M. Dodds, D. B. Fraser, "Optical Determination of OH in Fused Silica", *Journal of Applied Physics*, vol. 37, p. 3911 (1966).
V. S. Khotimchenko et al., "Determination of the Content of Hydrogen Dissolved in Quartz Glass . . . " *Journal of applied Spectroscopy*, vol. 46, No. 6, pp. 987–991 (1987).

*Primary Examiner*—William L. Sikes
*Assistant Examiner*—David R. Parsons
*Attorney, Agent, or Firm*—Evenson, McKeown, Edwards & Lenahan

[57] ABSTRACT

This invention relates to an optical member made of highly transparent, high-purity synthetic silica glass, to a method for manufacturing a blank or an optical member of such glass, and to the optical members themselves. The optical members have an absolute refractive index, $n_d$, of 1.460 or more and a hydrogen molecule concentration of at least $5 \times 10^{16}$ molecules/cm³ uniformly distributed throughout the glass and are particularly well suited for use in apparatus in which they are exposed to a high-power laser beam such as that produced by an excimer laser.

21 Claims, 4 Drawing Sheets

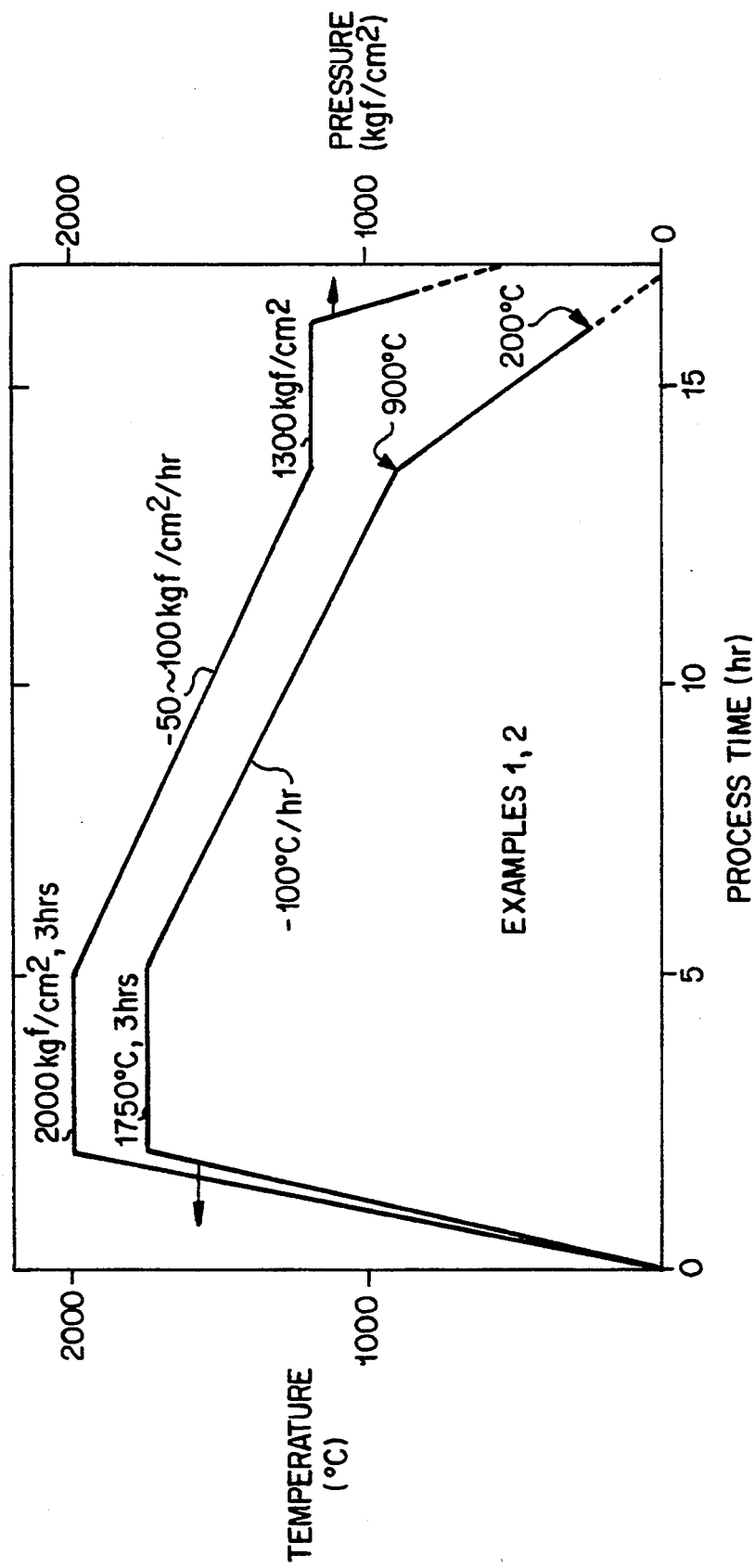

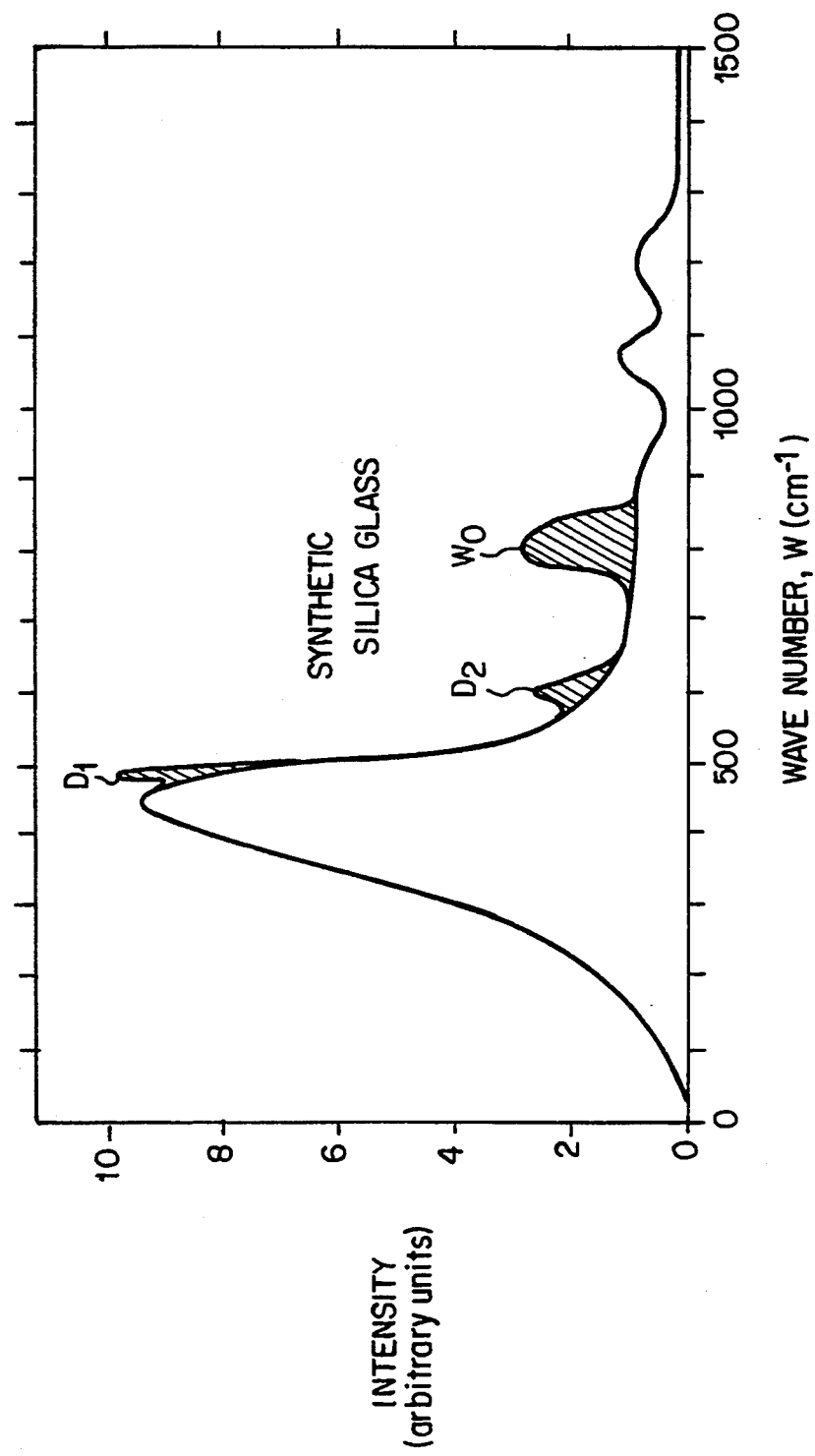

OPTICAL MEMBER MADE OF HIGH-PURITY AND TRANSPARENT SYNTHETIC SILICA GLASS AND METHOD FOR PRODUCTION THEREOF OR BLANK THEREOF

BACKGROUND OF THE INVENTION

1. [Field of the Invention]

The present invention relates to an optical member made of synthetic silica glass of high-purity and transparency, and a method for manufacture of a blank thereof or the optical member. The invention relates more especially to optical members assembled in various apparatuses employing such high-power laser beams as an excimer laser, or optical members assembled in apparatuses used in a radiation environment where they are exposed to gamma rays, X-rays or cosmic rays.

2. [Description of the Prior Art]

In recent years it is noted that high-power lasers such as the excimer laser, etc. are applicable to a lithographic technique for producing large scale integrated circuits (LSIs), a technique applying photochemistry, a processing technique for cutting and grinding, or laser nuclear fusion.

Attempts have been made to apply silica glass optical members such as lenses, prisms, mirrors, or optical fibers not only for communication but also for light or energy transmissions, or other optics, to transmit, to refract, to reflect, to absorb or to interfere with the high-power laser beams.

Attempts have also been tried to apply the silica glass optical members such as lenses, prisms, mirrors, fibers and so forth assembled in an optical apparatus for spacecraft, or an optical apparatus for nuclear reactor periphery operation in a radiation environment where they are exposed to gamma rays, X-rays or cosmic rays.

In the event, however, when the various optics made of silica glass are irradiated with visible light having wave lengths ranging from about 700 to 600 nm, ultraviolet light having wave lengths ranging from about 360 to 160 nm, or ionized radiation beams, the optics are apt to suffer structural damage.

An absorption band of wave length about 630 nm indicates the presence of the defect called a non-bridging oxygen hole center (NBOHC). An absorption band of wave length about 215 nm is the so called E' center. And there is another absorption band of wave length about 260 nm. Those absorption bands are generated upon irradiation with high-power laser beams over a long period, resulting in reducing the optical transmission for the visible light having wave lengths ranging about from 750 to 500 nm, and for the ultraviolet light having wave lengths ranging from about 360 to 160 nm to deteriorate the optical properties of the material.

It is, therefore, very difficult to improve the durability of silica glass against the high-power laser irradiation of beams which have the wave lengths described above, because the glass suffers the structural damage.

Further, it is confirmed that among the various types of lasers, the KrF excimer laser and the ArF excimer laser are the most powerful in subjecting the silica glass to optical damage.

The present inventors have first tried to produce an optical member with a fair measure of success from a standard synthetic silica glass of high-purity and high-homogeneity.

The inventors' study proceeded to develop the technique filed by the inventors as Japanese Pat. Appln. 1-145226, which is referred to as a prior application technique hereinafter, for doping with hydrogen in the synthetic silica glass described above as a basic material to suppress drastically the optical damage on the irradiation of ultraviolet light having a wave length less than about 250 nm.

In the doping method of the prior application technique, however, hydrogen is more doped in the surface region of the glass in contact with the dopant gas. It is rather difficult to dope homogeneously in the entire solid glass even in an atmosphere of elevated temperature. The difficulty tends to be amplified with the increase of the thickness of the glass to be doped. In this doping method, therefore, the laser damage prevention effect is limited to a certain maximum thickness.

Because the glass members for laser use should be high-purity and high-homogeneity synthetic glass, other starting glasses can not be used as the starting materials. Since glass in the synthetic, process is subjected within a short time to an elevated temperature of an oxyhydrogen flame, the reaction process seemingly is not sufficient to reach an equilibrium state to produce a stable structure. Therefore, the synthetic glass includes a glass structure of three member rings or four member rings which are not detected in quartz. It is believed that the unstable structures may contribute to the decrease of durability against laser irradiation. It is confirmed that the silica glass having the higher scattering peaks of wave numbers of 495 and 606 $cm^{-1}$ in laser Raman scattering spectrometry is inferior in laser durability.

To obviate the issue by the inventors as described above, the structure has been reformed with hydrogen doping. The procedure was merely a relief remedy not solving the issue substantially, but instead including the limitation on feasible thickness for doping as stated previously.

Once the synthetic silica glass has suffered the light or irradiation damage, a chemical bond between silicon and oxygen in the network structure generally is broken, which rejoins with other structures thus increasing the density and the local absolute refractive index.

Even when the refractive index is increased due to the breakage and recombination of the bonds between silicon and oxygen, with the presence of hydrogen molecules near the split bond, an OH group is formed by reaction with hydrogen molecules provided in the silica glass, whereby most of the split bonds are remedied to suppress the increase of refractive index. There still remains another issue to be solved when the silica glass is exposed to the high-power laser beam for a long period.

That is, though the initial deterioration can be improved with the presence of hydrogen, a further irradiation with the high-power laser beam causes exhaustion of the hydrogen within a short time, even if the hydrogen is included a concentration of more than $5 \times 10^{16}$ molecules/$cm^3$. No remedial effect can be expected with a hydrogen concentration of less than $1 \times 10^{16}$ molecules/$cm^3$.

In the prior technique as described above, the technique for doping the silica glass with hydrogen is disclosed for the treatment in atmospheric or high pressure gas at the elevated temperature from 200° to 1200° C. A similar technique for doping with hydrogen is also disclosed in Japanese Laid Open Pat. Appln. No. 1-201664, showing a technique possible for doping at ambient atmospheric pressure at an elevated temperature from 800° to 1,000° C.

These techniques handling the hydrogen at an elevated temperature involve an explosion hazard for which safety cares must be taken.

SUMMARY OF THE INVENTION

[Objects]

In considering the issues of the prior techniques above, it is an object of the present invention to provide an optical member which is more durable against high-power laser irradiation for a long period, thereby assuring the optical durability under laser irradiation, high-power light exposure, or ionizing irradiation for a long time. Such a feature mentioned above is called 'durability against laser irradiation' hereinafter.

Another object of the present invention is to provide a lump of optical glass having the durability against laser irradiation, in which, even though a lump of synthetic glass is used as a starting material, the synthetic glass is then subjected to a heat treatment as needed to densify and stabilize its structure.

Still another object of the present invention is to provide a lump of silica glass in a large size having the durability against laser irradiation, so that the silica glass can be ground to very thick prisms or lenses without limitation to a certain maximum thickness.

Yet another object of the present invention is to provide a method for producing an optical member made of silica glass including hydrogen molecules in the safest way without hydrogen explosion hazard.

[Constitution of the Invention]

[A. Synthetic Silica Glass]

The present invention is based on a prerequisite to use synthetic glass, more preferably, to use synthetic glass of high-transparency. The basic material to acquire the durability against laser irradiation, as described previously, should be high-purity, high-homogeneity, and of high-transparency. No material other than the synthetic silica glass can satisfy these conditions. The synthetic process time, however, is so brief at an elevated temperature, that the silica glass network structure can not relax to a stable structure.

It has been confirmed by the inventors, in the case when the synthetic glass has not reached the equilibrium state, that the unstable structure contains 3-member rings, or 4-member rings (F. L. Galeener, J. Non-Crys. Solo, 49 (1982)). Further study by the inventors has revealed that the 3-member rings and 4-member rings tend to decrease, while 6-member rings of the stable structure increase, if the silica glass is subjected to a heat treatment under a pressurized atmosphere.

It has been found by the inventors that the durability against laser irradiation is sufficiently secured, even to irradiation by a high-power laser beam, when the absolute refractive index, $n_d$, at a wave length of 589 nm is kept at 1.460 or higher. This constitutes the first feature of the present invention.

With the first feature, since the structure of the glass is stabilized thereby achieving the intention to make it densified, the bond breakage between silicon and oxygen is suppressed, wherein the intention can be realized to suppress the decreasing of the optical transmission and the local increasing of the absolute refractive index.

Additionally, the structure of 3-member rings and 4-member rings can be easily measured with a laser Raman scattering spectrometry referring the scattering peak (800 cm$^{-1}$) for the basic vibration between silicon and oxygen by the following Equations 1 and 2.

$$R1 = I_1 1\ (495\ cm^{-1})/I_o\ (800\ cm^{-1}) \qquad \text{Equ. 1,}$$

$$R2 = I_2 2\ (606\ cm^{-1})/I_o\ (800\ cm^{-1}) \qquad \text{Equ. 2,}$$

where, $I_1$: intensity of scattering peak at 495 cm$^{-1}$
$I_2$: intensity of scattering peak at 606 cm$^{-1}$, and
$I_o$: intensity of-scattering peak at 800 cm$^{-1}$.

The intensity ratios, for example, for a standard synthetic silica glass, the absolute refractive index $n_d$ of which is 1.458, are $R1 > 0.55$ and $R2 > 0.17$. On the other hand, the intensity ratios for the synthetic glass having the absolute refractive index $n_d$ higher than 1.460 can be reduced at least to $R1 < 0.55$ and $R2 < 0.17$, and more preferable to $R1 < 0.48$ and $R2 < 0.15$.

Furthermore, the probability of bond breakage between silicon and oxygen atoms is strongly influenced by the material stoichiometry. It has been found by the inventors that a surplus of oxygen atoms, as a result of a high oxygen flow rate during material deposition, results in the creation of non-bridging oxygen hole centers (NBOH). These NBOH-centers show a strong UV-light induced broad absorption centered at a wavelength of 265 nm, thus adversely influencing the light transmission below 300 nm. Furthermore, the creation rate of the 215 absorption band under UV-light exposure is increased.

On the other hand, as found by the inventors, a small deficiency of oxygen atoms in the material, as a result of a low oxygen flow rate during material deposition, completely avoids the creation of the 265 nm NBOH-absorption band and strongly depresses the creation rate of the 215 nm absorption.

By avoiding an oxygen surplus in the material, wherein the materials stoichiometry is set to $SiO_{2+x}$ with x in the range of $+0.0001$ to $-0.001$, the structure of the glass is stabilized and the decreasing of the optical transmission is further suppressed.

Even with the first feature mentioned above, it is impossible to completely eliminate the unstable structures. Though the breakage of bonds between silicon and oxygen atoms is suppressed, it is impossible to eliminate it completely.

Then, the present invention provides as the second feature to dissolve in the glass structure hydrogen molecules of concentration about more than $5 \times 10^{16}$ molecules/cm$^3$, or more preferably, of concentration about more than $1 \times 10^{17}$ molecules/cm$^3$ for the optical member applied especially for the high-power ultraviolet laser.

With the second feature, even though bond breakage occurs between silicon and oxygen, the reaction with hydrogen molecules prevents the formation of color centers, suppressing the decrease of optical transmission. Even though the bond breakage between the elements does occur, the formation of OH groups prevents the increase of refractive index.

Since the present invention has established the absolute refractive index, $n_d$, to be higher than 1.460, the bond breakage has little further effect. Thus, the consumption of hydrogen molecules results in drastically prolonging the durability against laser irradiation.

Some rare gases may be included in the optical members together with hydrogen. The rare gas doping improves the glass network structure for more stable structure to modify preferably the optical features.

Besides the increased refractive index and the stabilized glass structure containing hydrogen molecules therein, the other optical properties must be considered.

The wide ranges of the refractive index-inhomogeneity, $\delta n$, are not suitable for lenses or prisms application.

In the preferred embodiment of the present invention, the refractive index-inhomogeneity, $\delta n$, along the axis of the incident light beam should be less than $5 \times 10^{-6}$, more preferably, less than $2 \times 10^{-6}$ inclusively.

It has been shown by traditional techniques to improve the durability against laser irradiation that the metallic elements in the silica glass should be reduced. The presence of metallic elements decreases sharply the optical transmission within the range of ultra violet wave lengths, or more practically, decreases steeply the transmission at the wave length about 200 nm, which is not suitable for optical members.

The present invention, therefore, has established that the total content of Li, Na, and K is 300 mass ppb or less, the total content of Mg and Ca is 200 mass ppb or less, the total content of Ti, Cr, Fe, Ni and Cu is 500 mass ppb or less, and more preferably, the content of each of the elements Na, K, Li, Mg, Ca, Ti, Cr, Fe, Ni and Cu is less than 100 mass ppb.

Contrarily to the above, the presence of OH groups is preferable, which produces the desirable effects of improved durability against irradiation of ultraviolet laser beam for an extended period.

The OH group is one of the network terminators. The presence of an appropriate amount of the network terminators relieves strains of interatomic distance and distorted angles between the atoms in the structure, whereby the structure becomes relaxed. It is further believed that the hydrogen of the OH group acts to prevent the generation of the absorption bands such as the E' center.

In the present invention, therefore, the content of OH groups is established to be more than 10 mass ppm. More especially, the content of OH groups should be more than 50 mass ppm for the synthetic silica glass optical member applicable for the ultraviolet laser. Further, the content of OH groups should be more than 100 mass ppm for the synthetic silica glass optical member applicable for the high-power ultraviolet laser having a wave length about 250 nm or less.

Adding to the above, chlorine also acts similarly to OH groups as a network terminator. The bond energy, however, between silicon and chlorine is much weaker than that of silicon and the OH group. The presence of chlorine, therefore, is unfavorable for the durability against laser irradiation.

In the present invention, therefore, it is established that the content of chlorine in the optical member should be less than 500 mass ppm, or more preferably, the content of chlorine should be 200 mass ppm or less.

The optical member is applicable not only for an excimer laser beam, YAG harmonics laser beam and other apparatus Which use high-power ultraviolet laser beams, but also for lenses, prisms, windows, mirrors and light energy carriers or blanks thereof in an environment exposed to gamma rays, X-rays, cosmic rays or other radiation. It is preferably recommended to adopt the optical member formed of the transparent synthetic silica glass having the absolute refractive index $n_d$ Of 1.460 or more, containing hydrogen molecules of concentration about more than $5 \times 10^{16}$ molecules/cm$^3$ to an optical apparatus of which the light source is a YAG laser (1,064 nm), a He—Ne laser (633 nm), an Ar laser (from 350 to 515 nm), a KrF laser (248 nm) or an ArF excimer laser (193 nm ) .

Among the above applications, the apparatus assembled with the optical member of the present invention, of which the light source is the high-power excimer laser having an energy density of more than about 10 mj/cm$^2$ per pulse, is assured of having sufficient durability against laser irradiation for practical use, compared to the traditional optical member which is apt to deteriorate in its optical characteristics when used for an extended period.

[B. Generation of Hydrogen Molecules]

In the prior art, the dissolution of hydrogen in silica glass is performed with diffusion doping. The hydrogen diffusion doping method, as described previously, forms high-concentration of hydrogen at the surface region directly contacting with ambient hydrogen gas. It becomes the more difficult to diffuse the gas uniformly into the internal region, the thicker of glass is.

To achieve the object of the present invention, therefore, it requires a technique to include the hydrogen gas or molecules in the internal region. The heat treatment as described in the prior techniques in a high pressure hydrogen atmosphere at an elevated temperature still raises the safety problem with respect to explosion.

In the present invention, a measure is thought to form hydrogen molecules from such hydrogen elements as water, OH group or proton (H+) included in the silica glass, without using hydrogen molecules in the ambient gas. To perform the measure above, the glass containing hydrogen elements such as water, OH group or proton (H+) should be used as a starting material.

Thus, as the third feature of the present invention, the starting material is the synthetic silica glass, or more preferably, the ingot of synthetic silica glass prepared by an oxyhydrogen flame hydrolysis method.

In several production methods of synthetic silica glass such as the direct oxyhydrogen flame hydrolysis method (direct method, in short) or the CVD soot remelting method (soot method, in short) the oxyhydrogen flame is used. The origin for hydrogen molecules such as protons (H+) are naturally included in the silica glass during the synthesis.

In the present invention, the starting material is a lump of transparent silica glass, because the present invention is aimed at large size products circumventing the difficulties of doping hydrogen into thicker materials. The starting materials of powder or layer sheet type are not suitable for the optical member, since a succeeding fusing procedure under a high-pressure atmosphere sometimes leaves bubbles or granular structure in the glass resulting in a reduction in the durability against laser irradiation.

As the fourth feature of the present invention, the inventors provide means for developing the origin of hydrogen elements to hydrogen molecules. The means comprises a step for heating the ingot of synthetic silica glass to remelt it under a pressurized atmosphere of rare gases, and a step for keeping the atmosphere in a remelting state for a period as needed.

Though the reason why hydrogen molecules are generated in the process is not clear, it is possible to suppose that protons (H+), OH groups and water loosely bound in the network structure of the glass are disrupted or decomposed to generate hydrogen molecules under the pressurized atmosphere at the elevated temperature.

It is thereby made possible to provide hydrogen molecules in the structure of glass under an atmosphere free of hydrogen gas, if the atmosphere satisfies the two conditions described above. The ambient gas of atmosphere is not limited to 100% rare gases. An atmosphere including a small amount of hydrogen or nitrogen, for example, works for the purpose.

The hydrogen molecules generated in glass may be diffused to outside of glass, if the pressure of the atmosphere is immediately reduced. Further, strains may be formed in glass rendering it unsuitable for the optical member, if the atmosphere is subjected to rapid cooling to solidify the remelting glass subsequent to the step of reducing the pressure.

The present invention, therefore, adding to the two features described above, is characterized by a step of slowly cooling the remelted silica glass at least to the strain point under the pressurized atmosphere.

Thus, it is possible to be free from residual strain in glass having the birefringence of 5 nm/cm or less, whereby a preferable optical member is provided.

[C. Method for Production]

A method for production of the optical member mentioned in the Section A. will be described. The optical member contains hydrogen molecules with the concentration substantially evenly distributed throughout the glass regardless of the thickness of the silica glass with the enhanced refractive index.

The present invention is based on a prerequisite to use synthetic glass, more preferably, to use synthetic glass of high-transparency as a starting material. The starting material to acquire the durability against laser irradiation, as described previously, should be high-purity, high-homogeneity, and high-transparency. No material other than the synthetic silica glass can satisfy the requirements.

The lump of glass is adopted as the starting material, instead of powdery or granular materials even made of synthetic silica glass, because the material is subjected to a heat treatment for remelting under the pressurized atmosphere, and then to cooling which leaves bubbles or granular structure in the solidified glass resulting in a reduction in the durability against laser irradiation if powdery or granular materials are used.

Thus, the fifth feature of the present invention lies in heating the ingot of high-purity high-transparency synthetic silica glass in a high-pressure atmosphere substantially consisting of inert gases, or more precisely, heating in inert atmosphere at an elevated pressure at the temperature of 1,600° C. or more, above the softening point of the silica glass ingot for a period as needed. The viscosity as log $n$ is 7.6 at the softening point.

Since the ingot is subjected to the high-pressure of 1,000 kgf/cm² or more, the density of the glass structure will increase, whereby the absolute refractive index, $n_d$, (at wave length of 589 nm) increases to more than 1.460 after the process, or in other words more practically, the absolute refractive index of the glass, $n_d$, increases in a range from 0.002 to 0.005.

A heating process in an atmosphere containing rare gases and hydrogen mixture is also possible to introduce additional hydrogen in the glass. However, in an atmosphere at a temperature of more than 1,000° C. at a pressure of more than 1,000 kgf/cm², it is possible to contain more than $1 \times 10^{17}$ molecules/cm³ hydrogen in the glass without introducing hydrogen into the ambient gas. That is, the temperature does not necessarily need to be raised up to the remelting point, but it is sufficient to keep the temperature at about 1,000° C. or more in the high-pressure atmosphere.

The sixth feature of the present invention lies in the heating process that is subjected to an ambient atmosphere containing rare gases as the main component thereof.

The heating process fills up vacancies in the ring structures of the silica glass with rare gases, and forms hydrogen molecules as well stabilizing the network structure of the glass, whereby the resulting glass shows a high durability against high-power laser irradiation.

To achieve effective durability against ultraviolet laser irradiation, the glass should contain hydrogen molecules at a concentration of $5 \times 10^{16}$ molecules/cm³, or more preferably, at a concentration of $1 \times 10^{17}$ molecules/cm³. Thus, the synthetic glass should be silica glass produced from raw material gases including the element hydrogen, or produced by an oxyhydrogen flame.

The seventh feature of the present invention lies in a step for maintaining a pressurized atmosphere at a pressure of more than 500 kgf/cm² while slowly cooling until the temperature is below a temperature of about 900° C. which is below the strain point of about 1,000° C.

The process is controlled to relieve the internal strain and keeps the birefringence at less than 5 nm/cm, whereby a homogeneous silica glass is provided without decreasing the durability against laser irradiation.

Further, more precisely, the high-pressure heating process in the present invention is characterized by a cooling process where the cooling rate is less than 100° C./h in the temperature range from 1,200° to 900° C., whereby the lowest residual strain can be achieved.

In the case of a heating process in the temperature range from 1,000° to 1,600° C. if a lump of glass with striae in three dimensions is used as a starting material, the birefringence will be above 5 nm/cm, with which the optical requirement can not be satisfied. The striae are left remaining even after the high-pressure heating process and exert an adverse effect on optical properties. It is recommended in the present invention that a lump of highly-homogeneous silica glass of high-purity which is free of striae in at least one direction should be used as the starting material.

The vessel that contains the silica glass for the remelting or heating process is recommended to be of high-temperature resistant refractories or materials. Specifically tungsten, tantalum or platinum-rhodium alloys may be used.

BRIEF DESCRIPTION OF THE DRAWINGS

The invention will be described in further detail with reference to the accompanying drawings in which:

FIGS. 1(A) and 1(B) are a process chart showing a temperature pressure program in which FIG. 1(A) shows a process for Examples 1 and 2, and FIG. 1(B) shows a process for Example 3, FIG. 3 is a graph of Raman scattering spectrometry showing the defects in the silica glass.

DETAILED DESCRIPTION OF THE PREFERRED EMBODIMENTS

Figure 1B:
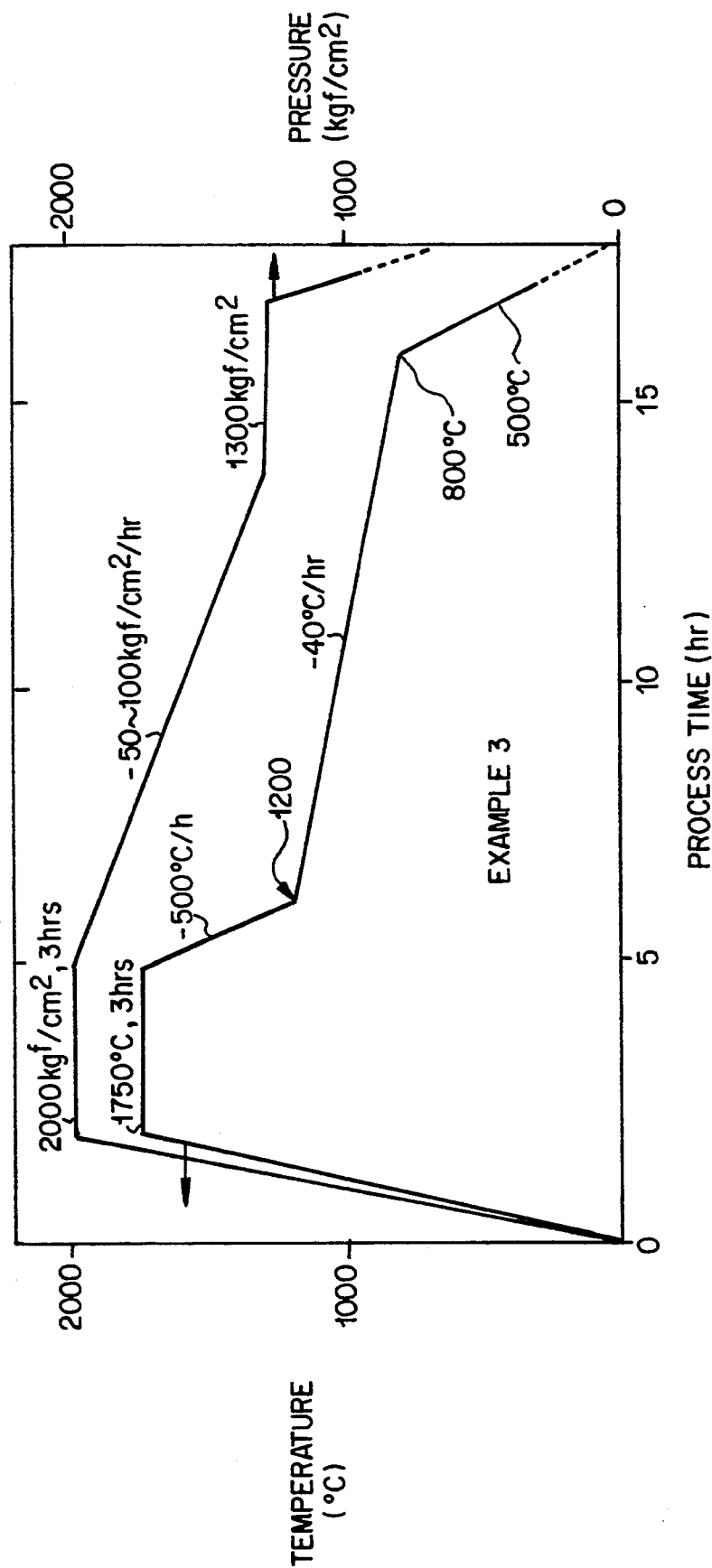

The invention will be described in further detail by the following working Examples.

A. [Examples 1 and 2.]

Raw material of silicon tetrachloride was distilled to remove impurities, and then stored in a vessel of stainless steel with a plastic lining of Polytetrafluoroethylene. A plurality of ingots of high-purity silica glass were synthesized from the high-purity raw material of silicon tetrachloride by the oxyhydrogen flame hydrolysis, that is, the direct method or the CVD soot remelting method or the soot method.

Concentrations of OH groups in the ingots were measured in a range from 600 to 630 mass ppm for the ingots produced by the direct method, and in a range from 180 to 200 mass ppm for the ingots produced by the soot method. Striae were detected in all the ingots.

The striae were observed in accordance with the Japanese Optical Glass Industrial Standards JOGIS 11-1975. The concentration of OH groups was measured in accordance with "Optical Determination of OH in Fused Silica" by D. M. Dodd, D. B. Fraser, Journal of Applied Physics, Vol. 37, 1966, p 3911.

The refractive index inhomogeneity, $\delta n$, was measured according to the optical interference method applied by the oil-on-plate method with an apparatus, Zygo Mark III System manufactured by Canon Co., Ltd. The light source was a He—Ne laser having a wavelength of 633 nm.

The ingots were subjected to the heating process above their softening point and to the slow cooling process, during which the ingots were physically turned over, thereby changing the softening direction to eliminate the striae. The treatment was repeated several times. With the repeated processes, the ingots were prepared without stria in three directions with the refractive index inhomogeneity, $\delta n$, less than $2 \times 10^{-6}$.

The contents of alkali metal elements such as Li, Na, and K, of alkaline earth elements such as Mg and Ca, and of transition metal elements such as Ti, Cr, Fe, Ni and Cu were measured, and the ingot showed good results of high-purity. That is, the total content of Li, Na and K was less than 300 mass ppb, the total content of Mg and Ca was less than 200 mass ppb, and the total content of Ti, Cr, Fe, Ni and Cu was less than 500 mass ppb. The concentration of chlorine in the ingot was in a range from 50 to 100 mass ppm. The refractive index, $n_d$, of the ingots was found to be 1.459.

The content of impurities was measured according to the atomic absorption method. The Cl concentration was measured according to the nephelometric analysis. The refractive index was measured with an Abbe's refractometer applying a wavelength of 589 nm at a temperature of 23° C.

A plurality of samples was prepared by cutting and grinding the ingots to form 100 mm dia. × 100 mm thick pieces.

From the sample, then, the specimens for the measurement of hydrogen molecules were prepared with a mirror finish on three surfaces suitable for laser Raman scattering spectrometry (Raman method, hereinafter). The procedure of the Raman method was practiced in accordance with the paper by V. S. Khotimchenko, et al., in Journal of Applied Spectroscopy, Vol. 46, No. 6, pp 987-991, June, 1987 in which: the specimens were irradiated by an Ar laser beam (488 nm), then measurements were made for the Raman scattering peak of wave number 4135 cm$^{-1}$ and the basic Raman scattering peak (800 cm$^{-1}$). The hydrogen molecule concentration, C, was calculated from the intensity ratio as follows:

$$C = \{[I(4135\ c^{-1})]/[I(800\ cm^{-1})]\} \times k\ [molecules/cm^3],$$

where k is a constant $$k = 1.22 \times 10^{21}.$$

The results for each specimen after the homogenizing heating/cooling processes showed a hydrogen concentration of less than $5 \times 10^{16}$ molecules/cm$^3$.

Each sample was put in a platinum-rhodium crucible, and then was subjected to a Hot Isostatic Pressing process (HIP process, hereinafter). The process was controlled to remelt in the atmosphere of 100% argon at the pressure of 2,000 kgf/cm$^2$ and elevated temperature of 1,750° C. for 3 hours. Then, according to the temperature-pressure chart as shown in FIG. 1(B), the temperature of the ambient atmosphere was cooled slowly to the temperature of 900° C. at the rate of 100° C./hr. The pressure was decreased to 1,300 kgf/cm$^2$ at a rate from 50 to 100 kgf/cm$^2$·hr. During the cooling stage of the HIP process, the pressure of 1,300 kg/cm$^2$ was maintained until the temperature dropped below 200° C. The temperature also had been cooled down slowly below 900° C. to the room temperature.

Figure 2:
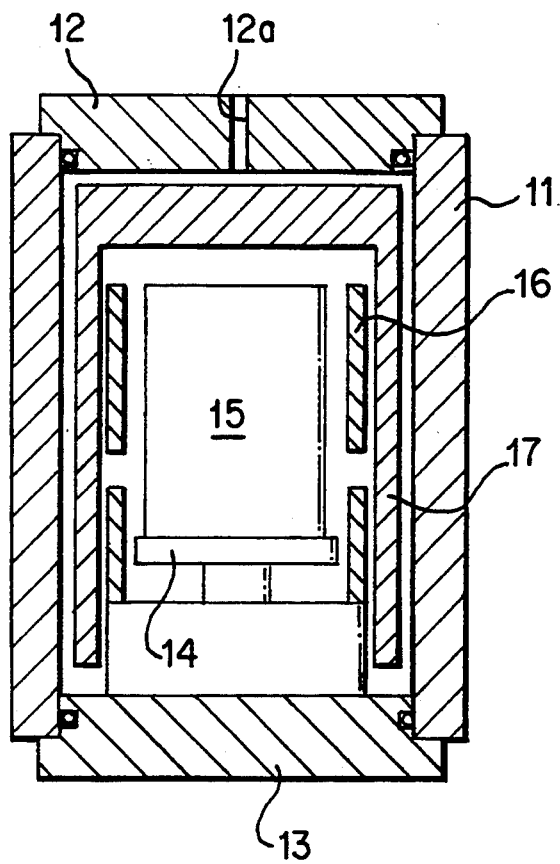
FIG. 2 is a front elevation section view showing a HIP apparatus for the production process of the present invention.

The apparatus used in the embodiment of the present invention was a Hot Isostatic Pressing device (HIP equipment hereinafter) manufactured by Kobe Steel Co., Ltd. The constitution of the HIP equipment will be described following the illustration shown in FIG. 2. Numeral 11 is a high-pressure cylinder supported with a bottom closure 13, and having a top closure 12 with a gas inlet 12a. The sample was set in a crucible 15 on a support 14 disposed in the cylinder 11. The crucible 15 is surrounded with a heater 16 that is insulated with an insulation mantle 17. No further description will be necessary, as the equipment has been well known.

B. [Samples for Examples 3 through 13.]

An ingot was synthesized, in which the OH group concentration was 730 mass ppm. The metallic impurities were analyzed and found to be satisfactory as desired in which: the total content of Li, Na and K was less than 300 mass ppb, the total content of Mg and Ca was less than 200 mass ppb, and the total content of Ti, Cr, Fe, Ni and Cu was less than 500 mass ppb. The chlorine concentration was 50 mass ppm.

A plurality of samples was prepared by cutting and grinding the ingots to form samples 100 mm dia. × 100 mm thick.

Then, each of the samples was set in a tungsten crucible to be placed in the HIP equipment. Each of the samples was subjected to the respective treatment process with the conditions described below.

[Example 3.]

In an ambient atmosphere of 100% argon gas at the pressure of 2,000 kgf/cm$^2$, the sample was remelted at the temperature of 1,750° C. for 3 hours. The temperature was cooled down to 1,200° C. at the rapid cooling rate of 500° C./hr, then, was cooled further to 800° C. at the slow cooling rate of 40° C./hr, as shown in the temperature-pressure chart in FIG. 1(B). Corresponding to the cooling process, the pressure was decreased to 1,300 kgf/cm² at the rate from 50 to 100 kgf/cm²·hr. The pressure of 1,300 kgf/cm² was maintained until the temperature reached 500° C. Then, the pressure was reduced slowly to atmospheric pressure. The temperature also was cooled to room temperature after the slow cooling stage down to 800° C.

[Examples 4 and 5.]

The maximum temperature of the HIP process was set at 1,650° C. for Example 4, and at 1,400° C. for Example 5 respectively. The other conditions, such as cooling rate of temperature and reduction rate of pressure, were the same as for Example 3 described above.

[Example 6.]

In an atmosphere of 100% argon gas at the pressure of 2,000 kgf/cm², the sample was heat treated at the temperature of 1,000° C. for 3 hours. The temperature was cooled down to 800° C. at the slow cooling rate of about 40° C./hr. Corresponding to the cooling process, the pressure was decreased to just above 1,000 kgf/cm². The pressure just above 1,000 kgf/cm² was maintained until the temperature cooled down to 200° C. The atmosphere was kept for a while, and then the pressure was reduced slowly to the atmospheric pressure. The temperature also was cooled down to room temperature.

[Example 7.]

In an atmosphere of 100% argon gas at the pressure of 2,000 kgf/cm², the sample was heated at the temperature of 500° C. for 3 hours. Keeping the pressure above 1,000 kgf/cm², the temperature was allowed to cool down to 200C. The atmosphere was kept for a while, and then the pressure was reduced slowly to atmospheric pressure. The temperature was also cooled down to room temperature.

[Example 8.]

In an atmosphere of 100% argon gas at the pressure of 1,000 kgf/cm², the sample was remelted at the temperature of 1,750° C. for 3 hours. The temperature was cooled down to 1,200° C. at the rapid cooling rate of 500° C./hr, then, was cooled down to 800° C. at the slow cooling rate of 10° C./hr. Keeping the pressure above 1,000 kgf/cm², the temperature was then allowed to cool down to 500° C. The atmosphere was kept for a while, and then the pressure was reduced slowly to atmospheric pressure. The temperature was also cooled down to room temperature, subsequent to the slow cooling process down to 800° C.

[Example 9.]

In an atmosphere of 100% argon gas at the pressure of 1 bar without pressurizing, the sample was remelted at the temperature of 1,750° C. for 3 hours. The temperature was cooled down to 1,200° C. at the rapid cooling rate of 500° C./hr, then, was cooled down to 800° C. at the slow cooling rate of 10° C./hr. Then, the temperature was allowed to cool down to room temperature.

[Example 10.]

The sample was subjected to an atmosphere of 100% nitrogen gas. The other conditions were the same as for Example 3.

[Example 11.]

The sample was placed in a crucible made of Al₂O₃. The other conditions were the same as for Example 3.

[Example 12.]

In an atmosphere of 100% argon gas at the pressure of 2,000 kgf/cm² the sample was remelted at the temperature of 1,750° C. for 3 hours. The temperature was cooled down to 1,200° C. at the rapid cooling rate of 500° C./hr. Then, the pressure was reduced to the atmospheric pressure at the rapid rate of 500 kgf/cm²·hr, while the temperature was cooled down to 800° C. at the slow cooling rate of 40° C./hr. The temperature was then allowed to cool down to room temperature.

[Example 13.]

In an atmosphere consisting of a mixture of 90% argon gas and 10% hydrogen at the pressure of 1,000 kgf/cm², the sample was heat treated at the temperature of 1,000° C. for 3 hours. The temperature was then cooled down to 800° C. at the slow cooling rate of about 10° C./hr. Keeping the pressure above 1,000 kgf/cm² the temperature was allowed to cool down to 500° C. The atmosphere was kept for a while, and then the pressure was reduced slowly to the atmospheric pressure. The temperature was also allowed to cool down to room temperature subsequent to the cooling process down to 800° C.

[Examples 14 and 15.]

To confirm the effects of the embodiment of the present invention, a lump of high-purity silica glass without OH groups was synthesized by a plasma method from high-purity silicon tetrachloride raw material. The silica glass was subjected to the stria removing process and the annealing process the same as the sample above, then was formed in the size described previously. The sample was subjected to the same process as Example 3. The sample was referred to as Example 14.

A lump of powdery natural quartz was remelted by Verneuil's method to form a sample as well. The sample was subjected to the same process as Example 3. The sample was referred to as Example 15.

C. [Evaluation of Examples 1 through 15.]

Each of samples for Examples 1 through 15 was formed in a plurality of specimens for evaluation in which: two pieces of each specimen were provided for evaluation of the durability against excimer laser irradiation in a size 20×20×10 mm thick with mirror finishing on both sides, two pieces of each specimen were provided for evaluation of the refractive index and Raman scattering in a size of 5×10×20 mm with mirror finishing on three faces, and a lump of powder for measuring dissolved gas contents weighing 1 g.

The measurements of refractive index and concentration of hydrogen molecules were carried out by the methods described previously. The dissolved gases were identified by gas mass spectrometry.

To evaluate the durability against KrF excimer laser irradiation, the irradiation conditions were adjusted such that the pulse energy was 175 mj/pulse, the energy density was about 400 mj/cm² per pulse, the repetition rate was 100 Hz, and the pulse duration was 17 nanoseconds. The irradiation conditions for the ArF excimer laser beam were adjusted such that: the pulse energy was 50 mj/pulse, the pulse energy density was about 200 mj/cm per pulse at higher power, the repetition rate was 100 Hz, and the pulse duration was 13 nanoseconds.

The pulse numbers were counted until the internal transmission decreased to 97% at the energy of 5.8 eV (wave length of about 214 nm) in 10 mm thick silica glass specimens. The pulse numbers were deemed as an index of the durability against laser irradiation. The internal transmission of each of the specimens which were exposed to the irradiation at 5.8 eV was more than 99.8%, except for those of Examples 11 and 15.

If the number of pulses before the internal transmission decreased to 97%, which remains for practical use, was about $2 \times 10^6$, then the performance was rated as Fine. A specimen for which number of pulses exceeded that number was regarded as Excellent. A specimen whose performance was less than that required for the rating of Fine but which seemed to be allowable for practical use was regarded as Fair. Specimens whose performance was insufficient received the rating Failure.

In the Raman method, as shown in FIG. 3, the two defect peaks at $D_1$:495 $cm^{-1}$ and $D_2$:606 $cm^{-1}$ correspond to the presence of 4-member rings and 3-member rings with reference to the basic vibration $W_0$:800 $cm^{-1}$. The intensity of the spectra of $D_1$ was measured by the hatched area confined by its own peak and the base border connecting the feet at 470 and 520 $cm^{-1}$ thereof. The intensities of $D_2$ and $W_0$ were measured respectively by the hatched areas confined by the corresponding peaks and the base borders connecting each foot at 580 and 640 $cm^{-1}$, and at 700 and 950 $cm^{-1}$.

The equations 1 and 2, therefore, shown previously for the intensity ratio could be modified, corresponding to $I_1$ $I_2$ and $I_0$:

$$R1 = D_1 1/W_0 \qquad \text{Equ. 1'},$$

$$R2 = D_2 1/W_0 \qquad \text{Equ. 2'},$$

where,
$D_1$: peak area at 495 $cm^{-1}$
$D_2$: peak area at 606 $cm^{-1}$, and
$W_0$: peak area at 800 $cm^{-1}$.

Findings of the characteristics and evaluations for the respective samples are given in Table 1.

[Example 1.]

The findings showed excellent characteristics with a higher absolute refractive index increased from 1.459 to 1.461, with a decrease of the scattering intensity of the $D_1$ and $D_2$ lines, with a higher concentration of hydrogen molecules up to more than $1 \times 10^{18}$ molecules/$cm^3$, and with fairly good findings in every respect to the stria, the homogeneity, $\delta n$, and the birefringence. The laser durability was rated as Excellent. Besides the characteristics shown in Table 1, the hydrogen concentration of the specimens showed no significant difference between the central part and the surface regions.

[Example 2.]

The findings showed excellent results similar to Example 1, except for the rating for the durability against ArF laser irradiation, which was attributable to a poor concentration of OH groups approaching 100 ppm.

[Example 3.]

The findings showed excellent results similar to Example 1. It was especially worth note that the striae were improved from free for one direction to free in three directions. The durability against laser irradiation was rated as Excellent for both KrF and ArF lasers.

[Example 4.]

The findings showed excellent results similar to Examples 1 through 3 above, except for the rating Fine for durability against ArF laser irradiation. It is believed that the low remelting process temperature did not reduce the unstable 3-member rings and 4-member rings up to expectations.

[Example 5.]

The findings exhibited fairly good results rated as Fines for durabilities against both types of laser irradiation, though the intensity ratios were not reduced compared to Example 4, because the maximum process temperature of 1,400° C. was below the softening point of about 1,600° C. of silica glass.

[Examples 6 and 7.]

For Example 6 the remelting process temperature was far below that of Example 5 above, in which the unstable structures of 3-member and 4-member rings remained to a considerable extent and with a hydrogen molecule content of $1 \times 10^{17}$ molecules/$cm^3$. The findings still exhibited Fair rates passable for practical use for both types of laser beams.

In Example 7, however, the findings showed Failure ratings for durability against both types of laser irradiation due to the low temperature of 500° C. in the heat treatment process. It is considered, therefore, that the conditions of Example 6 would be minimum requirements.

[Examples 8 and 9.]

In Example 8 in which the pressure for the remelting process was kept as low as 1,000 kgf/$cm^2$, the findings gave Fine ratings for durability against both types of laser irradiation. Whereas the finding in Example 9 was rated as Failure for both durabilities, in which the sample was subjected only to atmospheric pressure. To achieve the object of the present invention, therefore, it is necessary to subject the glass to a heat treatment under high-pressure, or more practically, at an elevated temperature from 500° to 1,000° C. or more under a pressurized atmosphere.

[Example 10.]

It was found in Example 10 that the atmosphere of nitrogen gas, instead of argon gas, resulted in Failure ratings for the durabilities against both types of laser irradiation. It is believed that the nitrogen atmosphere under the high pressure may produce nitrides in the silica glass. In the nitrogen atmosphere, it was believed that the problem could not be prevented, if the glass were subjected to the temperature of the softening point of about 1,600° C. or below.

[Example 11.]

As shown in Example 11, it was found that the crucible made of $Al_2O_3$ was harmful for the durabilities against both types of laser irradiation, because alumina could react with the silica. It is recommended, therefore, to use crucibles made of tungsten, tantalum or platinum-rhodium alloys.

[Example 12.]

In Example 12, the rapid reduction of the pressure to atmospheric pressure that was followed by the heating process resulted in the rating Failure. It is required, therefore, that the pressure must be kept as high as 1,000 kgf/cm² or more until the temperature decreases to at least 900° C.

[Example 13.]

In Example 13 in which the atmosphere consisted of mainly argon gas with additional hydrogen gas, it was found that the glass contained the highest concentration of hydrogen of $1 \times 10^{19}$ molecules/cm³, even though the pressure of 1,000 kgf/cm² and the temperature of 1,000° C. were low for the HIP process. It showed also good findings resulted in the Excellent ratings for the durabilities against both types of laser irradiation.

[Example 14.]

In Example 14 on the other hand, in which the sample was made by the plasma method so as not to include OH groups, it was confirmed that the sample contains the lowest concentration of hydrogen molecules, and the sample earned the rating Failure for the durabilities against both types of laser irradiation, too. It is a prerequisite for the present invention, therefore, that the starting material should be synthesized silica glass, including OH groups, made by either the direct method or the soot method.

[Example 15.]

In Example 15 in which the sample was made from natural quartz, it was found that the test of the durabilities against both types of laser irradiation resulted in ratings of unacceptable, even though the hydrogen concentration had been increased to a fairly good level.

D. [Preparation and Evaluation of Example 16.]

A lump of preform for optical fibers was synthesized by the soot method. The characteristics of the core part of the preform were measured. The concentrations were found to be of OH group 100 mass ppm, of chlorine 30 mass ppm, and of hydrogen molecule $5 \times 10^{16}$ molecules/cm³. And the refractive index, $n_d$, was found to be 1.458. The clad part of the preform was doped with fluorine.

The preform was drawn to fiber form having a core 1 mm in dia., with a clad layer 1.5 mm in dia. The fiber was subjected to the HIP process shown in Table 1 to prepare samples for Example 16.

Findings are shown in Table 1 in which the hydrogen molecule concentration has been measured according to the Raman method, and the refractive index has been measured for the powdery sample of the fiber core part by means of the immersion method.

Evaluation was made for durability against KrF laser irradiation. A piece of fiber 1 m in length was irradiated continuously under the conditions of the initial transmission power of 5 mj/pulse, and of the transmission power density of 600 mj/cm²·pulse. The pulse numbers were counted with the intention of counting until the initial transmission power was reduced to 50%. The findings showed advantageous results in that the transmission power energy still remained more than 50% after irradiation by $2 \times 10^6$ pulses.

[Preparation and Evaluation of Example 17.]

The durability against gamma ray irradiation was evaluated for the sample of Example 13. A lump of silica glass 10 mm thick was irradiated at a rate of 10 R/hr for 10 hours. The optical transmission for light having a wave length of 215 nm was subsequently measured and was found to be a preferable amount of 80%.

The foregoing description and examples have been set forth merely to illustrate the invention and are not intended to be limiting. Since modifications of the described embodiments incorporating the spirit and substance of the invention may occur to persons skilled in the art, the scope of the invention should be construed to include all variations falling within the ambit of the appended claims and equivalents thereof.

TABLE 1

| | Example No. | 9 | 10 | 11 | 12 |
|---|---|---|---|---|---|
| Starting Glass | Production Method | Direct Method | Direct Method | Direct Method | Direct Method |
| | OH Group Conc.: mass ppm | 730 | 730 | 730 | 730 |
| | Stria(e) | Free in 1 Direction | Free in 1 Direction | Free in 1 Direction | Free in 1 Direction |
| Process Conditions | Ambient Gas(es) | Ar | $N_2$ | Ar | Ar |
| | Maximum Temperature: °C. | 1,750, 3 hrs | 1,750, 3 hrs | 1,750, 3 hrs | 1,750, 3 hrs |
| | Temperature Decreasing Rate: °C./h | 500 till 1,200° C., 10 till 800° C., then left to cool | 500 till 1,200° C., 40 till 800° C., then left to cool | 500 till 1,200° C., 40 till 800° C., then left to cool | 500 till 1,200° C., 40 till 800° C., then left to cool |
| | Maximumun Pressure: kgf/cm² | 1 abs. | 2,000 | 2,000 | 2,000 |
| | Pressure Conditions; kgf/cm² | — | Kept 1,300 or more till 500° C., then left to release | Kept 1,300 or more till 500° C., then left to release | Release at the rapid rate of 500 kgf/cm²/hr to room temp. |
| | Crucible Material | Tungsten | Tungsten | Alumina | Tungsten |
| Characteristics of Processed Glass | Absolute Refractive Index: nd | 1.458 | 1.461 | 1.461 | 1.458 |
| | Dissolved Gas(es) | $O_2, H_2O, H_2$ | $N_2, H_2$ | $Ar, H_2$ | $Ar, H_2$ |
| | Hydrogen Conc.: molecules/cm³ | $<5 \times 10^{16}$ | $3 \times 10^{18}$ | $3 \times 10^{18}$ | $8 \times 10^{16}$ |
| | $R_1$ Ratio | 0.55 | 0.45 | 0.43 | 0.45 |
| | $R_2$ Ratio | 0.17 | 0.15 | 0.12 | 0.15 |
| | Stria(e) | Free in 1 Direction | Free in 3 Directions | Free in 3 Directions | Free in 1 Direction |
| | Maximam Refractive Index Fluctation: δn | $5 \times 10^{-6}$ | $2 \times 10^{-6}$ | $2 \times 10^{-6}$ | $2 \times 10^{-6}$ |
| | Birefringence: nm/cm | <5 | 10 | <5 | 5 |
| | KrF Laser at 400 mJ/cm²·p Pulse Numbers till the Internal Transmission decrease to 97% at the Energy of 5.8 eV | $<1 \times 10^5$ | $<1 \times 10^5$ | $1 \times 10^6$ | $<1 \times 10^5$ |
| | Durability against | Failure | Failure | Fine | Failure |

TABLE 1-continued

| | | | | | |
|---|---|---|---|---|---|
| | ArF Laser at 200 mJ/cm$^2 \cdot$ p | KrF Irradiation Pulse Numbers till the Internal Transmission decrease to 97% at the Energy of 5.8 eV | $<1 \times 10^5$ | $<1 \times 10^5$ | Out of Question | $<1 \times 10^5$ |
| | | Duability against ArF Irradiation | Failure | Failure | Failure | Failure |
| | Example No. | | 13 | 14 | 15 | 16 |
| Starting Glass | Production Method | | Direct Method | Plasma Method | Verneuil's Method | Soot Method Fiber |
| | OH Group Conc.: mass ppm | | 730 | <1 | 210 | 100 |
| | Stria(e) | | Free in 1 Direction | Free in 1 Direction | Striae in 3 Directions | — |
| Process Conditions | Ambient Gas(es) | | H$_2$ 10%/Ar 90% | Ar | Ar | H$_2$ 5%/Ar 95% |
| | Maximum Temperature: °C. | | 1,000, 3 hrs | 1,750, 3 hrs | 1,750, 3 hrs | 1,000, 1 hr |
| | Temperature Decreasing Rate: °C./h | | 10 till 800° C., then left to cool | 500 till 1,200° C., 40 till 800° C., then left to cool | 500 till 1,200° C., 40 till 800° C., then left to cool | 100 till 800° C., then left to cool |
| | Maximumun Pressure: kgf/cm$^2$ | | 1,000 | 2,000 | 2,000 | 1,000 |
| | Pressure Conditions; kgf/cm$^2$ | | Kept 1,000 till 500° C., then left to release | Kept 1,000 or more till 500° C., then slowly reduced | Kept 1,300 or more till 500° C., then left to release | Kept 1,000 or more till 500° C., then slowly reduced |
| | Crucible Material | | Tungsten | Tungsten | Tungsten | Silicon Carbide |
| Characteristics of Processed Glass | Absolute Refractive Index: nd | | 1.461 | 1.461 | 1.461 | 1.460 to 1.465 |
| | Dissolved Gas(es) | | H$_2$ | Ar | Ar, H$_2$ | H$_2$ |
| | Hydrogen Conc.: molecules/cm$^3$ | | $5 \times 10^{19}$ | $<5 \times 10^{16}$ | $4 \times 10^{17}$ | $1 \times 10^{19}$ |
| | R$_1$ Ratio | | 0.50 | — | ? | — |
| | R$_2$ Ratio | | 0.14 | — | ? | — |
| | Stria(e) | | Free in 1 Direction | Free in 3 Directions | Striae in 3 Directions | — |
| | Maximam Refractive Index Fluctration: δn | | $1 \times 10^{-6}$ | $1 \times 10^{-5}$ | $1 \times 10^{-5}$ | — |
| | Birefringence: nm/cm | | 5 | 5 | 5 | — |
| | KrF Laser at 400 mJ/cm$^2 \cdot$ p | Pulse Numbers till the Internal Transmission decrease to 97% at the Energy of 5.8 eV | $>1 \times 10^6$ | $<1 \times 10^4$ | Out of Question | Upon Irradiation of $2 \times 10^{16}$ pulses, showed the Internal Transmission of 50%, or more. |
| | | Durability against KrF Irradiation | Excellent | Failure | Failure | Excellent |
| | ArF Laser at 200 mJ/cm$^2 \cdot$ p | Pulse Numbers till the Internal Transmission decrease to 97% at the Energy of 5.8 eV | $>1 \times 10^6$ | $<1 \times 10^4$ | Out of Question | — |
| | | Duability against ArF Irradiation | Excellent | Failure | Failure | — |

Ratings: Excellent > Fine > Fair > Failure

What is claimed is:

1. An optical member exhibiting improved resistance to degradation upon exposure to ultraviolet laser radiation, said optical member consisting of synthetic silica glass having a refractive index $n_d$ of at least 1,460 at a wavelength of 589 nm, a hydrogen molecule content substantially evenly distributed throughout the glass of at least $5 \times 10^{16}$ molecules/cm$^3$, and Raman scattering intensity ratios R$_1$ and R$_2$ of less than 0.48 and less than 0.15, respectively, where R$_1$ is the ratio of the Raman scattering peak intensity (I$_1$) at a wave number of 495 cm$^{-1}$ to the Raman scattering peak intensity (I$_0$) at a wave number of 800 cm$^{-1}$, and R$_2$ is the ratio of the Raman peak scattering intensity (I$_2$) at a wave number of 606 cm$^{-1}$ to I$_0$ as defined above.

2. An optical member according to claim 1, wherein said optical member has a hydrogen molecule content of at least $1 \times 10^{17}$ molecules/cm$^3$ substantially evenly distributed throughout the glass.

3. An optical member according to claim 1, wherein said optical member is doped with a rare gas.

4. An optical member according to claim 3, wherein said optical member is doped with argon.

5. An optical member according to claim 1, wherein said glass has a maximum refractive index fluctuation, δn, along an optical path therethrough of less than $5 \times 10^{-6}$.

6. An optical member according to claim 5, wherein said optical member has a maximum refractive index fluctuation, δn, along an optical path therethrough of less than $2 \times 10^{-6}$.

7. An optical member according to claim 1, wherein said silica glass contains less than 500 ppm chlorine by weight.

8. An optical member according to claim 7, wherein said silica glass contains less than 200 ppm chlorine by weight.

9. An optical member according to claim 1, wherein said optical member is free of striae in at least one direction.

10. An optical member according to claim 1, wherein said optical member has a birefringence of less than 10 nm/cm.

11. An optical member according to claim 10, wherein said optical member has a birefringence of less than 5 nm/cm.

12. An optical member according to claim 1, wherein said optical member contains at least 10 ppm of OH groups, by weight.

13. An optical member according to claim 1, wherein said optical member contains a total amount of Li, Na and K of at most 300 ppb, by weight, a total amount of Mg and Ca of at most 200 ppb, by weight, and a total amount of Ti, Cr, Fe, Ni and Cu of at most 500 ppb, by weight.

14. An optical member according to claim 1, wherein said optical member is selected from the group consisting of lenses, prisms, filters, windows, mirrors, and semi-finished members for producing one of the foregoing.

15. In combination, an optical member according to claim 1, and a laser light source selected from the group consisting of YAG lasers (1064 nm), He—Ne lasers (633 nm), Ar lasers (350 to 515 nm), KrF lasers (248 nm) and ArF excimer lasers; wherein said optical member is exposed to light from said laser light source.

16. A combination according to claim 15, wherein said laser light source emits a laser beam having an energy density of at least about 10 mj/cm$^2$ per pulse.

17. In combination, an optical member according to claim 1, and a source of radiation selected from the group consisting of gamma rays, X-rays and cosmic rays, wherein said optical member is exposed to radiation from said source.

18. An optical member according to claim 1, wherein said silica glass contains silicon atoms and oxygen atoms in a Si:O ratio of 1:(2+x), where x is in the range from −0.001 to +0.0001.

19. An optical member exhibiting improved resistance to degradation upon exposure to ultraviolet laser radiation, said optical member being formed by synthesizing a solid ingot of silica glass by oxyhydrogen flame hydrolysis; heat treating said glass at a temperature of at least 1000° C. under an atmosphere at a pressure of at least 1000 kgf/cm$^2$ consisting essentially of rare gas for a period of time sufficient to obtain a hydrogen molecule content substantially evenly distributed throughout the glass of at least $5 \times 10^{16}$ molecules/cm$^3$; cooling the heat treated glass to a temperature below the strain point of the glass while maintaining an elevated pressure of at least 500 kgf/cm$^2$, whereby the rate of cooling in the temperature range between the lower of 1200° C. or the maximum heat treatment temperature and said temperature below the strain point of the glass is at most 100° C./hr; and forming the cooled glass into an optical member.

20. An optical member according to claim 19, wherein said optical member is heat treated at a temperature of at least 1600° C.

21. An optical member according to claim 19, wherein said heat treated glass is cooled to a temperature below 900° C. while maintaining an elevated pressure of at least 1000 kgf/cm$^2$.

* * * * *